United States Patent
Lee et al.

(10) Patent No.: US 7,497,414 B2
(45) Date of Patent: Mar. 3, 2009

(54) CURVED SLIT VALVE DOOR WITH FLEXIBLE COUPLING

(75) Inventors: Jae-Chull Lee, San Jose, CA (US); David Berkstresser, Los Gatos, CA (US)

(73) Assignee: Applied Materials, Inc., Santa Clara, CA (US)

(*) Notice: Subject to any disclaimer, the term of this patent is extended or adjusted under 35 U.S.C. 154(b) by 371 days.

(21) Appl. No.: 11/326,759

(22) Filed: Jan. 6, 2006

(65) Prior Publication Data
US 2006/0151735 A1    Jul. 13, 2006

Related U.S. Application Data

(63) Continuation-in-part of application No. 10/867,100, filed on Jun. 14, 2004.

(51) Int. Cl.
*F16K 1/16* (2006.01)
(52) U.S. Cl. .................. 251/303; 251/177; 251/333; 49/40
(58) Field of Classification Search ........... 251/177, 251/301, 303, 334, 176, 192, 193, 333; 49/40, 49/41, 221
See application file for complete search history.

(56) References Cited

U.S. PATENT DOCUMENTS

| | | | |
|---|---|---|---|
| 3,557,837 A | 1/1971 | Giwosky et al. | |
| 3,976,330 A | 8/1976 | Babinski et al. | |
| 4,047,624 A | 9/1977 | Dorenbos | |
| 4,178,113 A | 12/1979 | Beaver, II et al. | |
| 4,311,542 A | 1/1982 | Mueller et al. | |
| 4,512,391 A | 4/1985 | Harra | |
| 4,680,061 A | 7/1987 | Lamont, Jr. | |
| 4,687,542 A | 8/1987 | Davis et al. | |
| 4,693,777 A | 9/1987 | Hazano et al. | |
| 4,709,655 A | 12/1987 | Van Mastrigt | |
| 4,759,681 A | 7/1988 | Nogami | |
| 4,770,590 A | 9/1988 | Hugues et al. | |
| 4,775,281 A | 10/1988 | Prentakis | |
| 4,784,377 A | 11/1988 | Woodward | |
| 4,785,962 A | 11/1988 | Toshima | |
| 4,801,241 A | 1/1989 | Zajac et al. | |
| 4,816,098 A | 3/1989 | Davis et al. | |
| 4,822,001 A * | 4/1989 | Sisk ........................ | 251/306 |

(Continued)

FOREIGN PATENT DOCUMENTS

EP    0359525    3/1990

(Continued)

OTHER PUBLICATIONS

Notice of Second Office Action dated Nov. 23, 2007 for Chinese Patent Application No. 200510113224.4.

(Continued)

*Primary Examiner*—John K Fristoe, Jr.
(74) *Attorney, Agent, or Firm*—Patterson & Sheridan LLP

(57) ABSTRACT

Embodiments of an apparatus for sealing a substrate transfer passage in a chamber are provided. In one embodiment, an apparatus for sealing a substrate transfer passage in a chamber includes an elongated door member having a concave sealing face coupled to an actuator by a flexible coupling. The flexible coupling configured to allow movement of the door member relative to the lever arm in at least two planes.

9 Claims, 10 Drawing Sheets

U.S. PATENT DOCUMENTS

| | | | |
|---|---|---|---|
| 4,828,224 | A | 5/1989 | Crabb et al. |
| 4,836,733 | A | 6/1989 | Hertel et al. |
| 4,846,102 | A | 7/1989 | Ozias |
| 4,857,689 | A | 8/1989 | Lee |
| 4,863,547 | A | 9/1989 | Shidahara et al. |
| 4,870,923 | A | 10/1989 | Sugimoto |
| 4,895,107 | A | 1/1990 | Yano et al. |
| 4,911,103 | A | 3/1990 | Davis et al. |
| 4,913,929 | A | 4/1990 | Moslehi et al. |
| 4,923,584 | A | 5/1990 | Bramhall, Jr. et al. |
| 4,951,601 | A | 8/1990 | Maydan et al. |
| 4,952,299 | A | 8/1990 | Chrisos et al. |
| 4,966,519 | A | 10/1990 | Davis et al. |
| 4,989,543 | A | 2/1991 | Schmitt |
| 4,990,047 | A | 2/1991 | Wagner et al. |
| 5,001,327 | A | 3/1991 | Hirasawa et al. |
| 5,020,475 | A | 6/1991 | Crabb et al. |
| 5,044,871 | A | 9/1991 | Davis et al. |
| 5,060,354 | A | 10/1991 | Chizinsky |
| 5,131,460 | A | 7/1992 | Krueger |
| 5,186,718 | A | 2/1993 | Tepman et al. |
| 5,187,115 | A | 2/1993 | Coleman |
| 5,199,483 | A | 4/1993 | Bahng |
| 5,202,716 | A | 4/1993 | Tateyama et al. |
| 5,224,809 | A | 7/1993 | Maydan et al. |
| 5,227,708 | A | 7/1993 | Lowrance |
| 5,252,807 | A | 10/1993 | Chizinsky |
| 5,254,170 | A | 10/1993 | Devibiss et al. |
| 5,259,881 | A | 11/1993 | Edwards et al. |
| 5,259,883 | A | 11/1993 | Yamabe et al. |
| 5,261,935 | A | 11/1993 | Ishii et al. |
| 5,288,379 | A | 2/1994 | Namiki et al. |
| 5,292,393 | A | 3/1994 | Maydan et al. |
| 5,352,294 | A | 10/1994 | White et al. |
| 5,355,066 | A | 10/1994 | Lowrance |
| 5,374,147 | A | 12/1994 | Hiroki et al. |
| 5,376,212 | A | 12/1994 | Saiki |
| 5,404,894 | A | 4/1995 | Shiraiwa |
| 5,421,889 | A | 6/1995 | Pollock et al. |
| 5,443,346 | A | 8/1995 | Murata et al. |
| 5,445,484 | A | 8/1995 | Kato et al. |
| 5,447,409 | A | 9/1995 | Grunes et al. |
| 5,464,313 | A | 11/1995 | Ohsawa |
| 5,469,035 | A | 11/1995 | Lowrance |
| 5,470,784 | A | 11/1995 | Coleman |
| 5,474,410 | A | 12/1995 | Ozawa et al. |
| 5,512,320 | A | 4/1996 | Turner et al. |
| 5,516,732 | A | 5/1996 | Flegal |
| 5,536,128 | A | 7/1996 | Shimoyashiro et al. |
| 5,562,383 | A | 10/1996 | Iwai et al. |
| 5,570,994 | A | 11/1996 | Somekh et al. |
| 5,586,585 | A | 12/1996 | Bonora et al. |
| 5,588,827 | A | 12/1996 | Muka |
| 5,607,009 | A | 3/1997 | Turner et al. |
| 5,609,689 | A | 3/1997 | Kato et al. |
| 5,611,655 | A | 3/1997 | Fukasawa et al. |
| 5,611,865 | A | 3/1997 | White et al. |
| 5,615,988 | A | 4/1997 | Wiesler et al. |
| 5,616,208 | A | 4/1997 | Lee |
| 5,636,964 | A | 6/1997 | Somekh et al. |
| 5,655,277 | A | 8/1997 | Galdos et al. |
| 5,674,786 | A | 10/1997 | Turner et al. |
| 5,685,684 | A | 11/1997 | Kato et al. |
| 5,695,568 | A | 12/1997 | Sinha et al. |
| 5,697,749 | A | 12/1997 | Iwabuchi et al. |
| 5,700,127 | A | 12/1997 | Harada et al. |
| 5,716,207 | A | 2/1998 | Mishina et al. |
| 5,738,767 | A | 4/1998 | Coad et al. |
| 5,751,003 | A | 5/1998 | Rose et al. |
| 5,784,799 | A | 7/1998 | Kato et al. |
| 5,793,050 | A | 8/1998 | Rose et al. |
| 5,795,355 | A | 8/1998 | Moran |
| 5,820,679 | A | 10/1998 | Yokoyama et al. |
| 5,833,426 | A | 11/1998 | Marohl |
| 5,855,681 | A | 1/1999 | Maydan et al. |
| 5,855,726 | A | 1/1999 | Soraoka et al. |
| 5,882,165 | A | 3/1999 | Maydan et al. |
| 5,884,009 | A | 3/1999 | Okase |
| 5,891,251 | A | 4/1999 | MacLeish et al. |
| 5,902,088 | A | 5/1999 | Fairbairn et al. |
| 5,909,994 | A | 6/1999 | Blum et al. |
| 5,913,978 | A | 6/1999 | Kato et al. |
| 5,934,856 | A | 8/1999 | Asakawa et al. |
| 5,942,013 | A | 8/1999 | Akimoto |
| 5,944,857 | A | 8/1999 | Edwards et al. |
| 5,951,770 | A | 9/1999 | Perlov et al. |
| 5,954,472 | A | 9/1999 | Hofmeister et al. |
| 5,961,269 | A | 10/1999 | Kroeker |
| 5,989,346 | A | 11/1999 | Hiroki |
| 5,997,235 | A | 12/1999 | Hofmeister |
| 6,007,675 | A | 12/1999 | Toshima |
| 6,012,192 | A | 1/2000 | Sawada et al. |
| 6,016,611 | A | 1/2000 | White et al. |
| 6,034,000 | A | 3/2000 | Heyder et al. |
| 6,039,770 | A | 3/2000 | Yang et al. |
| 6,042,623 | A | 3/2000 | Edwards |
| 6,044,534 | A | 4/2000 | Seo et al. |
| 6,048,154 | A | 4/2000 | Wytman |
| 6,059,507 | A | 5/2000 | Adams |
| 6,079,693 | A | 6/2000 | Ettinger et al. |
| 6,082,950 | A | 7/2000 | Altwood et al. |
| 6,086,362 | A | 7/2000 | White et al. |
| 6,089,543 | A | 7/2000 | Freerks |
| 6,106,634 | A | 8/2000 | Ghanayem et al. |
| 6,143,083 | A | 11/2000 | Yonemitsu et al. |
| 6,145,673 | A | 11/2000 | Burrows et al. |
| 6,176,667 | B1 | 1/2001 | Fairbairn et al. |
| 6,176,668 | B1 | 1/2001 | Kurita et al. |
| 6,192,827 | B1 | 2/2001 | Welch et al. |
| 6,193,507 | B1 | 2/2001 | White et al. |
| 6,206,176 | B1 | 3/2001 | Blonigan |
| 6,213,704 | B1 | 4/2001 | White et al. |
| 6,215,897 | B1 | 4/2001 | Beer et al. |
| 6,224,680 | B1 | 5/2001 | Toshima |
| 6,235,634 | B1 | 5/2001 | White et al. |
| 6,250,869 | B1 | 6/2001 | Kroeker |
| 6,254,328 | B1 | 7/2001 | Wytman |
| 6,270,582 | B1 | 8/2001 | Rivkin et al. |
| 6,286,230 | B1 | 9/2001 | White et al. |
| 6,315,512 | B1 | 11/2001 | Tabrizi et al. |
| 6,318,945 | B1 | 11/2001 | Hofmeister |
| 6,338,626 | B1 | 1/2002 | Saeki |
| 6,340,405 | B2 | 1/2002 | Park |
| 6,382,895 | B1 | 5/2002 | Konishi et al. |
| 6,410,455 | B1 | 6/2002 | Kuribayashi et al. |
| 6,431,807 | B1 | 8/2002 | Stevens et al. |
| 6,435,868 | B2 | 8/2002 | White et al. |
| 6,450,750 | B1 | 9/2002 | Heyder et al. |
| 6,486,444 | B1 | 11/2002 | Fairbairn et al. |
| 6,503,365 | B1 | 1/2003 | Kim et al. |
| 6,517,303 | B1 | 2/2003 | White et al. |
| 6,558,509 | B2 | 5/2003 | Kraus et al. |
| 6,568,552 | B1 | 5/2003 | Tabrizi et al. |
| 6,568,899 | B1 | 5/2003 | Kuribayashi et al. |
| 6,602,797 | B2 | 8/2003 | Kuribayashi et al. |
| 6,609,869 | B2 | 8/2003 | Aggarwal et al. |
| 6,610,150 | B1 | 8/2003 | Savage et al. |
| 6,647,665 | B1 | 11/2003 | Tabrizi et al. |
| 6,949,143 | B1 | 9/2005 | Kurita et al. |
| 2002/0034886 | A1 | 3/2002 | Kurita et al. |
| 2002/0137346 | A1 | 9/2002 | Donaldson et al. |
| 2002/0159864 | A1 | 10/2002 | Lowrance |
| 2004/0149210 | A1 | 8/2004 | Fink |

| | | | |
|---|---|---|---|
| 2005/0095088 A1 | 5/2005 | Kurita et al. | |

FOREIGN PATENT DOCUMENTS

| | | |
|---|---|---|
| EP | 0607797 | 7/1994 |
| EP | 0 608 620 | 8/1994 |
| EP | 0608633 | 8/1994 |
| EP | 0684630 | 11/1995 |
| EP | 0756316 | 1/1997 |
| EP | 0 935 279 | 8/1999 |
| JP | 64-028933 | 1/1989 |
| JP | 02-152251 | 6/1990 |
| JP | 3136345 | 6/1991 |
| JP | 03-274746 | 12/1991 |
| JP | 04-098848 | 3/1992 |
| JP | 04-240721 | 8/1992 |
| JP | 05-013551 | 1/1993 |
| JP | 05-092580 U | 5/1993 |
| JP | 5-179447 | 7/1993 |
| JP | 05-283500 | 10/1993 |
| JP | 06-104326 | 4/1994 |
| JP | 06-156624 | 6/1994 |
| JP | 06-163505 | 6/1994 |
| JP | 7-86169 | 3/1995 |
| JP | 8-264452 | 10/1996 |
| JP | 10-107126 | 4/1998 |
| JP | 10-308427 A | 11/1998 |
| JP | 00-195925 | 7/2000 |
| JP | 2003-197705 A | 7/2003 |
| KR | 2000-0050578 | 8/2000 |
| WO | WO 99/13504 | 3/1999 |
| WO | WO 99/18603 | 4/1999 |
| WO | WO 99/59928 | 11/1999 |
| WO | WO 99/60609 | 11/1999 |
| WO | WO 99/60610 | 11/1999 |
| WO | WO 99/60611 | 11/1999 |
| WO | WO 99/60612 | 11/1999 |
| WO | WO 99/61350 | 12/1999 |
| WO | WO 00/02228 | 1/2000 |

OTHER PUBLICATIONS

Official Action for Taiwan Patent Application No. 94119682 dated Dec. 21, 2007.
Korean Office Action for KR Application No. 2007-1440.
Iscoff, R., ed, "Dry Etching Systems: Gearing Up for Larger Wafers", Semiconductor International, Oct. 85, pp. 49-60.
Declaration of Thomas B. Brezocsky, dated Jan. 29, 1999.
Chinese Office Action, Application No. 200710003843.7, dated Jul. 4, 2008.
Office Action dated Aug. 26, 2008 for Japanese Patent Application No. 2005-172824. (APPM/009101-JAPA).

* cited by examiner

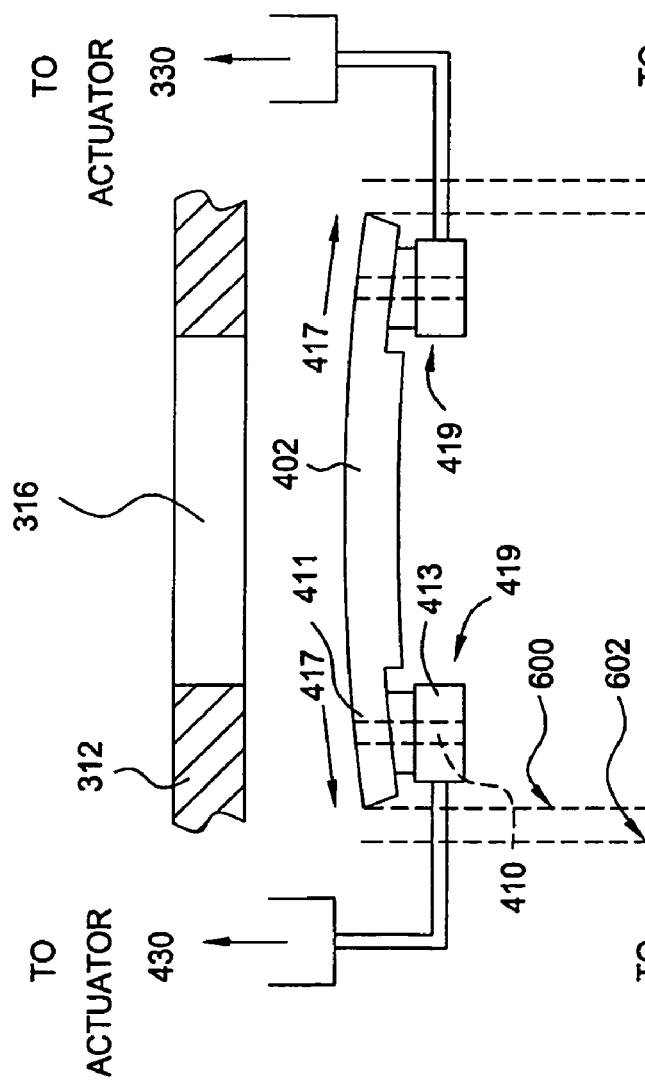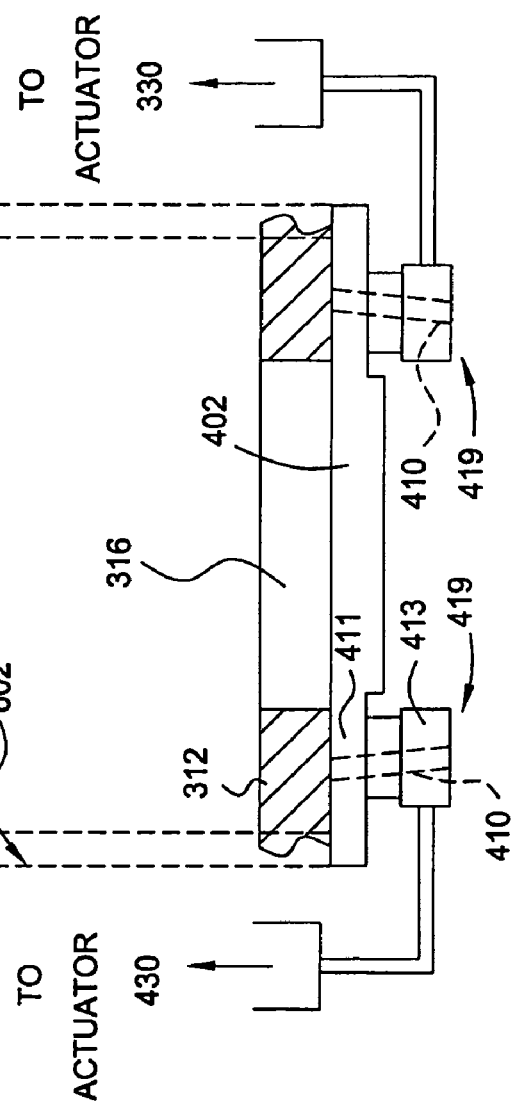

CURVED SLIT VALVE DOOR WITH FLEXIBLE COUPLING

CROSS-REFERENCE TO RELATED APPLICATION

This application is a continuation-in-part of U.S. patent application Ser. No. 10/867,100, entitled "CURVED SLIT VALVE DOOR", filed Jun. 14, 2004, which is hereby incorporated by reference in its entirety.

BACKGROUND OF THE INVENTION

1. Field of the Invention

The embodiments of the invention generally relate to a slit valve door for sealing substrate passages in vacuum processing systems.

2. Background of the Related Art

Thin film transistors (TFT) are commonly used for active matrix displays such as computer and television monitors, cell phone displays, personal digital assistants (PDAs), and an increasing number of other devices. Generally, flat panels comprise two glass plates having a layer of liquid crystal materials sandwiched therebetween. At least one of the glass plates includes one conductive film disposed thereon that is coupled to a power source. Power, supplied to the conductive film from the power source, changes the orientation of the crystal material, creating a pattern display.

With the marketplace's acceptance of flat panel technology, the demand for larger displays, increased production and lower manufacturing costs have driven equipment manufacturers to develop new systems that accommodate larger size glass substrates for flat panel display fabricators. Current glass substrate processing equipment is generally configured to accommodate substrates up to about five square meters. Processing equipment configured to accommodate substrate sizes exceeding five square meters is envisioned in the immediate future.

Glass substrate processing is typically performed in a cluster tool by subjecting a substrate to a plurality of sequential processes to create devices, conductors, and insulators on the substrate. Each of these processes is generally performed in a process chamber configured to perform a single step of the production process. In order to efficiently complete the entire sequence of processing steps, the cluster tool includes a number of process chambers coupled to a central transfer chamber. A robot is housed in the transfer chamber to facilitate transfer of the substrate between the process chambers and a load lock chamber. The load lock chamber allows substrates to be transferred between the vacuum environment of the cluster tool and an ambient environment of a factory interface. Such cluster tools for glass substrate processing are available from AKT, Inc., a wholly-owned subsidiary of Applied Materials, Inc., of Santa Clara, Calif.

As the substrate size for manufacturing flat panel display grows, the manufacturing equipment for these substrates becomes larger in size as well. Accordingly, the door or gate that isolates one vacuum chamber (or load lock chamber) from another becomes larger, or, specifically longer, since the slot opening between the two chambers has to become wider to accommodate the large width of the substrate passing through the slot opening. The increasing length of the door poses technical challenges for obtaining a good isolation seal between the two chambers, which is maintained by an elastomer seal disposed around the slot opening between the door and a chamber wall.

FIG. 1A depicts a partial sectional view of a substrate passage 108 formed through a chamber body 106 and selectively sealed by a conventional slit valve door 110. Conventional slit valve doors are typically comprised of a flat member of aluminum having a long lateral span. A closing force is applied toward the center of the door 110 by brackets 102 attached, as shown in FIGS. 1A-B, to a stiff rotating shaft 104. The door 110 is rotated between a position sealing the passage 108 (as shown in FIG. 1A) and a position clear of the passage 108 by an actuator 118 coupled to the shaft 104. A seal 116 is disposed between the door 110 and chamber body 106.

The force required to load the seal 116 in order to obtain good chamber isolation is high. The high load applied near the center of the door 110 results in a high loading force approximate the center of the door 110 and a substantially lower sealing force near the ends of the door, as depicted by force arrows 112. The shaft 104 may deflect while under load as shown by the phantom shaft 120, as the door 110 has a long span between its bearing supports 114 disposed in the walls of the chamber body 106 and the brackets 102 coupled to the center of the door 110. Deflection of the shaft 104 while the door 110 is in a closed position further aggravates the low loading condition of the seal at the ends of the door. The low sealing force at the edge of the door may lead to undesirable leakage through the passage 108.

In order to provide a stiffer door for more uniform seal loading, the door and/or the shaft may be fabricated from thicker materials or materials having higher modulus. However, this approach increases the cost of the load lock chamber, as high strength materials are typically expensive, and a larger load lock chamber may be required to accommodate the larger, high strength door with adequate clearance during operation. A larger load lock chamber is undesirable due to the increased material and manufacturing costs of the chamber itself, along with increased pump capacity required to pump down the larger load lock volume. Moreover, increased load lock volume typically requires increased pump time which has an adverse affect on system throughput.

The use of the curved slit valve has been proposed to address these concerns and is described in commonly assigned and previously incorporated U.S. patent application Ser. No. 10/867,100, entitled "CURVED SLIT VALVE DOOR", filed Jun. 14, 2004. The implementation of a curved slit valve door has presented new engineering challenges. For example, as the door sealing surface becomes flat when pressed against the planar chamber wall to seal the slit valve passage, the change in the projected length of the curved slit valve door should be accommodated to prevent excess wear of the door actuation mechanism.

Therefore, there is a need for an improved slit valve door.

SUMMARY OF THE INVENTION

Embodiments of an apparatus for sealing a substrate transfer passage in a chamber are provided. In one embodiment, an apparatus for sealing a substrate transfer passage in a chamber includes an elongated door member having a concave sealing face coupled to an actuator by a flexible coupling.

In another embodiment, an apparatus for sealing a substrate transfer passage in a vacuum chamber includes an elongated door member having a concave sealing face coupled to a lever arm by a flexible coupling. The flexible coupling configured to allow lateral movement of the door member relative to the lever arm.

In yet another embodiment, a flexible coupling connecting a curved slit valve door to an actuation mechanism includes a plurality of resilient bushings. The bushings accommodate relative movement between the door and the actuation mechanism in at least two planes. In one embodiment, the movement may be rotational, while in another embodiment, the movement between rotational in a first plane and rotation in a second plane.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

FIG. 6A is a sectional view of one embodiment of a curved slit valve door in an opened position;

FIG. 6B is a sectional view of one embodiment of a curved slit valve door rotated closed;

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The invention generally provides an improved slit valve door that is particularly suitable for use in large area substrate processing chambers. The slit valve door includes a curved sealing face and a flexible coupling, which accommodates changes in the projected length of the door, thereby extending the door actuating mechanism's service life while minimizing unwanted particles generation associated with binding of rotating components. The invention is described below as utilized in a flat panel processing system, such as those available from AKT, a division of Applied Materials, Inc., Santa Clara, Calif. However, it should be understood that the invention has utility for sealing substrate transfer passages in other types of processing equipment having different configurations.

Figure 1A:
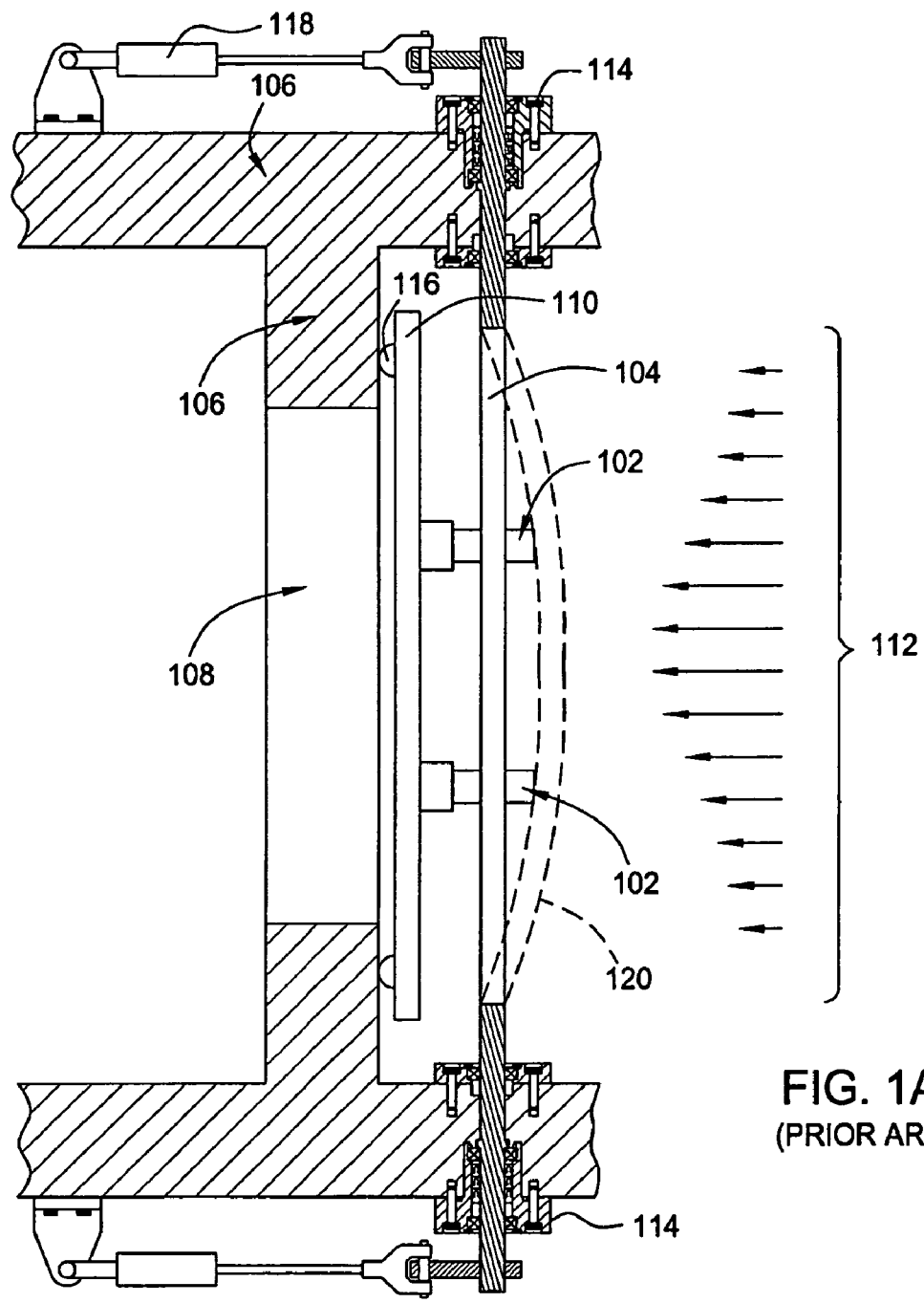
FIG. 1A is a partial sectional view of a chamber body having a substrate passage selectively sealed by a conventional slit valve door.
Figure 1B:
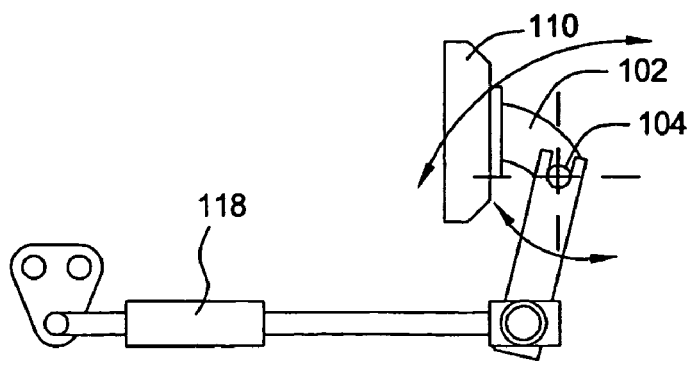
FIG. 1B is side view, with the chamber body removed, of a door actuator and the conventional slit valve door of FIG. 1A.
Figure 2:
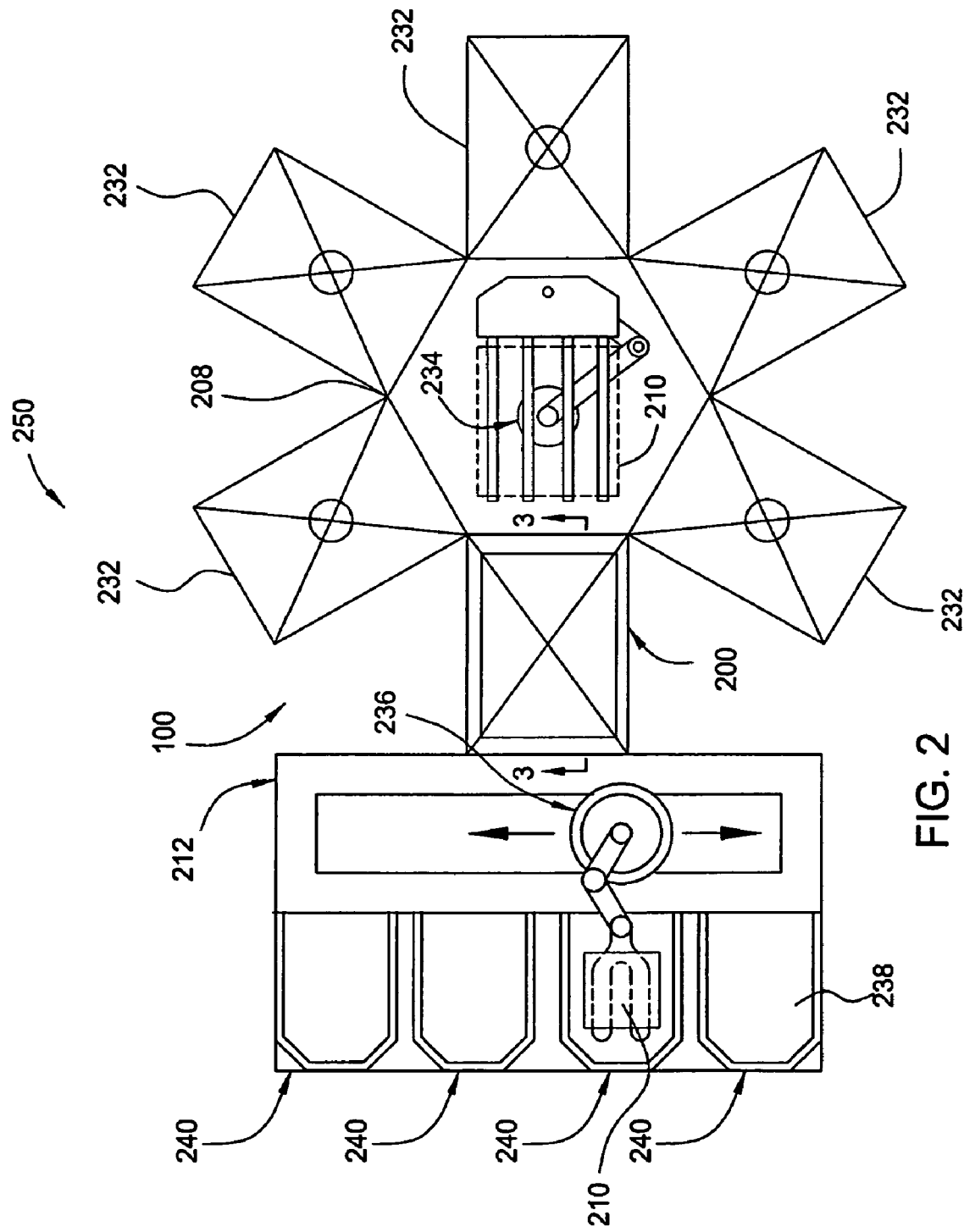
FIG. 2 is a top plan view of one embodiment of a processing system for processing large area substrates having a load lock chamber of the invention.

FIG. 2 is a top plan view of one embodiment of a process system 250 suitable for processing large area substrates (e.g., glass or polymer substrates having a plan area greater than about 0.16 square meters). The process system 250 typically includes a transfer chamber 208 coupled to a factory interface 212 by a load lock chamber 200. The transfer chamber 208 has at least one vacuum robot 234 disposed therein that is adapted to transfer substrates between a plurality of circumscribing process chambers 232 and the load lock chamber 200. The process chambers 232 may be a chemical vapor deposition chamber, a physical vapor deposition chamber, a metrology chamber or a thermal processing chamber, among others. Typically, the transfer chamber 208 is maintained at a vacuum condition to eliminate the necessity of adjusting the pressures between the transfer chamber 208 and the individual process chambers 232 after each substrate transfer.

The factory interface 212 generally includes a plurality of substrate storage cassettes 238 and at least one atmospheric robot 236. The cassettes 238 are generally removably disposed in a plurality of bays 240 formed on one side of the factory interface 212. The atmospheric robot 236 is adapted to transfer substrates 210 between the cassettes 238 and the load lock chamber 200. Typically, the factory interface 212 is maintained at or slightly above atmospheric pressure.

Figure 3:
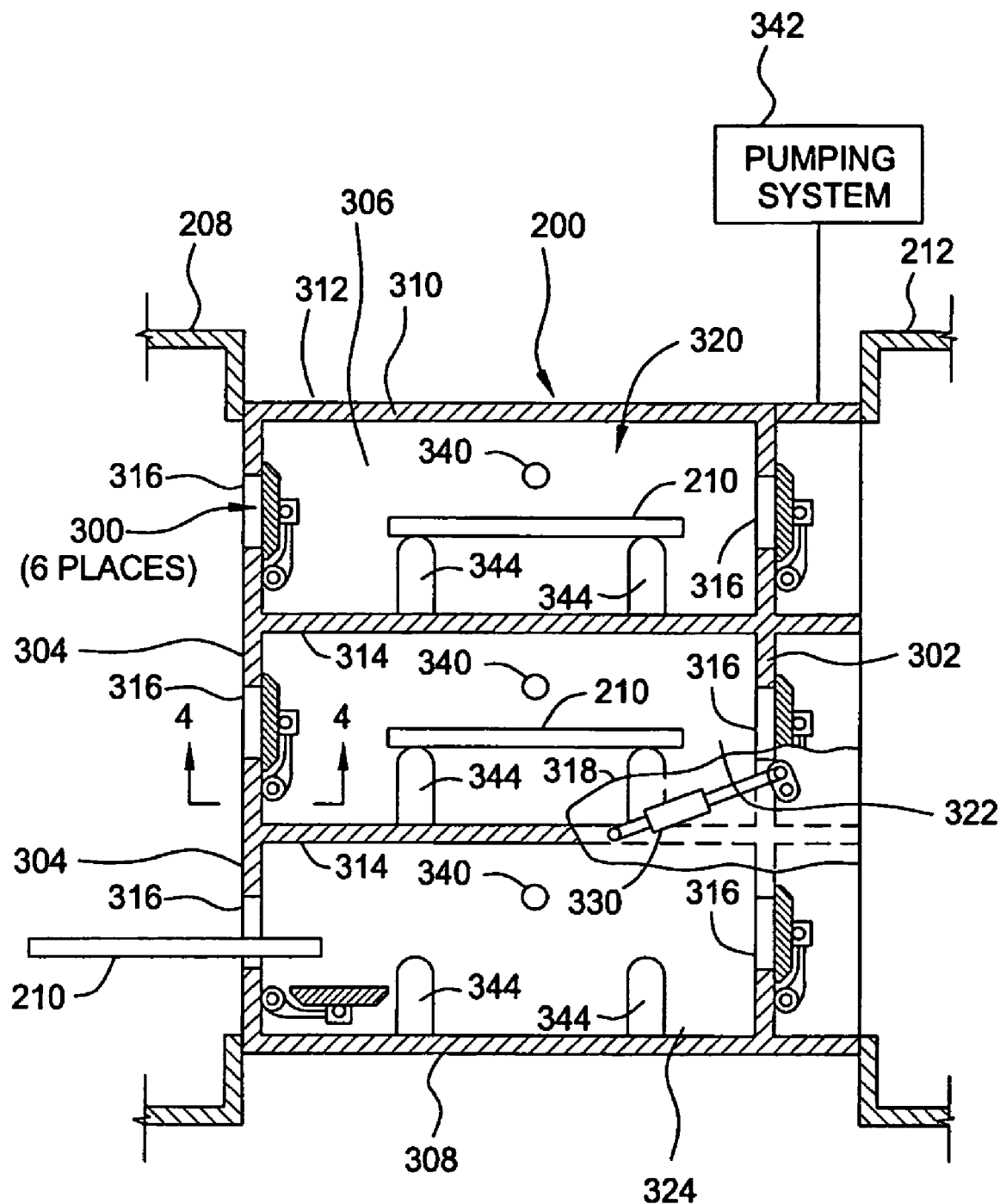
FIG. 3 is a sectional view of the load lock chamber taken along section lines 3-3 of FIG. 2.

FIG. 3 is a sectional view of one embodiment of the load lock 200 of FIG. 2. The load lock chamber 200 includes slit valve door assemblies 300 adapted to seal the passages 316 between the factory interface 212 and the transfer chamber 208. One example of a load lock chamber that may be adapted to benefit from the invention is described in U.S. Provisional Application Ser. No. 60/512,727, entitled "LOAD LOCK CHAMBER FOR LARGE AREA SUBSTRATE PROCESSING SYSTEM", filed Oct. 20, 2003, by Kurita et al., and U.S. patent application Ser. No. 09/464,362, entitled DUAL SUBSTRATE LOADLOCK PROCESS EQUIPMENT, filed Dec. 15, 1999, by Kurita et al., all of which are hereby incorporated by reference in their entireties. It is contemplated that the inventive slit valve door assembly 300 may be utilized with load lock chambers having alternative configurations. It is also contemplated that the slit valve door assembly 300 may also be utilized to selectively seal substrate ports formed in the transfer chamber 208, processing chambers 232 or other vacuum chambers.

In the embodiment depicted in FIG. 3, the load lock chamber 200 has a chamber body 312 that includes a plurality of vertically-stacked, environmentally-isolated substrate transfer chambers that are separated by vacuum-tight, horizontal interior walls 314. Although three single substrate transfer chambers 320, 322, 324 are shown in the embodiment depicted in FIG. 3, it is contemplated that the chamber body 312 of load lock chamber 200 may include two or more vertically-stacked substrate transfer chambers. For example, the load lock chamber 200 may include N substrate transfer chambers separated by N−1 horizontal interior walls 314, where N is an integer greater than one.

The substrate transfer chambers 320, 322, 324 are each configured to accommodate a single large area substrate 210 so that the volume of each chamber may be minimized to enhance fast pumping and vent cycles. In the embodiment depicted in FIG. 3, each substrate transfer chamber 320, 322, 324 has an interior volume of about less than about 2000 liters, and in one example an internal volume of about 1400 liters, to accommodate substrates having a plan surface area of greater than about 3.7 square meters, such as greater than or equal to five square meters. It is contemplated that a substrate transfer chamber of the present invention having other widths, lengths and/or heights may be configured to accommodate different size substrates.

The chamber body 312 includes first sidewall 302, a second sidewall 304, a third sidewall 306, a bottom 308 and a top 310. A fourth sidewall 318 (partially shown in FIG. 3) is opposite the third sidewall 306. The body 312 is fabricated from a rigid material suitable for use under vacuum conditions. The chamber body 312 is fabricated from a single block (e.g., one piece) of aluminum or other suitable material, or fabricated from modular sections.

The substrate 210 is supported by a plurality of substrate supports 344 above the bottom 308 of the first substrate transfer chamber 320 and the interior walls 314 bounding the bottom of the second and third substrate transfer chambers 322, 324. The substrate supports 344 are configured and spaced to support the substrate 210 at an elevation above the bottom 308 (or walls 314) to avoid contact of the substrate with the chamber body 312. The substrate supports 344 are configured to minimize scratching and contamination of the substrate. In the embodiment depicted in FIG. 3, the substrate supports 344 are stainless pins having a rounded upper end 346. Other suitable substrate supports are described in U.S. Pat. No. 6,528,767, filed Mar. 5, 2003; U.S. patent application Ser. No. 09/982,406, filed Oct. 27, 2001; and U.S. patent application No. 60/376,857, filed Feb. 27, 2003, all of which are incorporated by reference in their entireties.

At least one of the sidewalls of each of the substrate transfer chambers 320, 322, 324 includes at least one port 340 formed therethrough and coupled to a pumping system 342 to facilitate controlling the pressure within the interior volume of each chamber. The pumping system 342 includes vent, pumps and flow controls that enable the pumping system 342 to selectively vent or pump down a predetermined one of the substrate transfer chambers 320. 322, 324. One example of a pumping system that may be adapted to benefit from the invention is described in the previously incorporated U.S. Provisional Application Ser. No. 60/512,727, entitled "LOAD LOCK CHAMBER FOR LARGE AREA SUBSTRATE PROCESSING SYSTEM", filed Oct. 20, 2003, by Kurita et al.

Each of the substrate transfer chambers 320, 322, 324 defined in the chamber body 312 includes two substrate access ports 316. The ports 316 are configured to facilitate the entry and egress of large area substrates 210 from the load lock chamber 200. In the embodiment depicted in FIG. 3, the substrate access ports 316 of each of the substrate transfer chambers 320, 322, 324 are disposed on opposite sides of the chamber body 312, however, the ports 316 may alternatively be positioned on adjacent walls of the body 312. In one embodiment, the width of the first and second substrate access port 316, 316 are, but not limited to, at least 1365 millimeters.

Each of the substrate access ports 316 are selectively sealed by a respective slit valve door assembly 300 that are adapted to selectively isolate the first substrate transfer chamber 320 from the environments of the transfer chamber 208 and the factory interface 212. Each slit valve door assembly 300 is moved between an open and closed position by at least one actuator 330 (one actuator 330 is normally positioned outside the chamber body 312 on the fourth wall 318 in FIG. 3).

Figure 4:
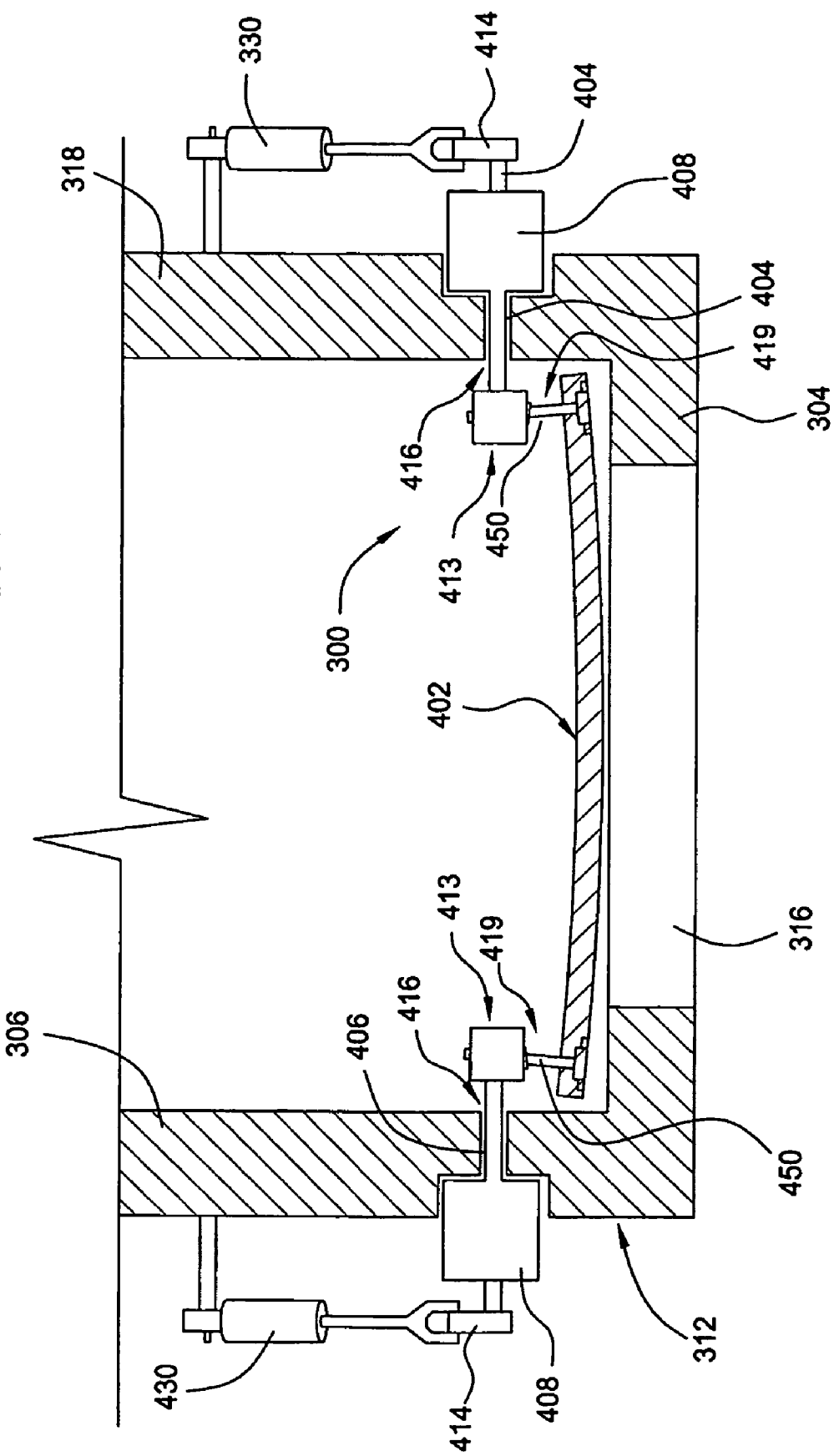
FIG. 4 is a sectional view of the load lock chamber taken along section lines 4-4 of FIG. 3.

FIG. 4 is a horizontal sectional view of the load lock chamber 200 through one of the slit valve door assemblies 300. The slit valve door assembly 300 includes a door member 402 coupled to at least a first shaft 404 by a lever arm 413. The first shaft 404 and lever arm 413 are rotated by the actuator 330 to move the door member 402 between open and closed positions. In the embodiment depicted in FIG. 4, the slit valve door assembly 300 includes a second shaft 406 coupled by a lever arm 413 to the door member 402. A second actuator 430, shown coupled to the exterior of the third wall 306 of the chamber body 312, is used in conjunction with the actuator 330 to move the door member 402. The second actuator 430 cooperates with the actuator 330 to rotate the door member 402. The first and second actuators 330, 430 may be a hydraulic cylinder, a pneumatic cylinder, motor or other actuator suitable for rotating the shafts 404, 406.

The lever arms 413 coupled to each shaft 404, 406 are connected by a flexible coupling 419 to the door member 402. The flexible coupling 419 allows the door member 402 to flex, change length, pivot and bend without binding the shafts 404, 406 or other component utilized to move the door member 402.

In one embodiment, the flexible coupling 419 includes a linking member 450. The linking member 450 facilitates rotation of the door member 402 in at least two planes relative to the lever arm 413.

Figure 5:
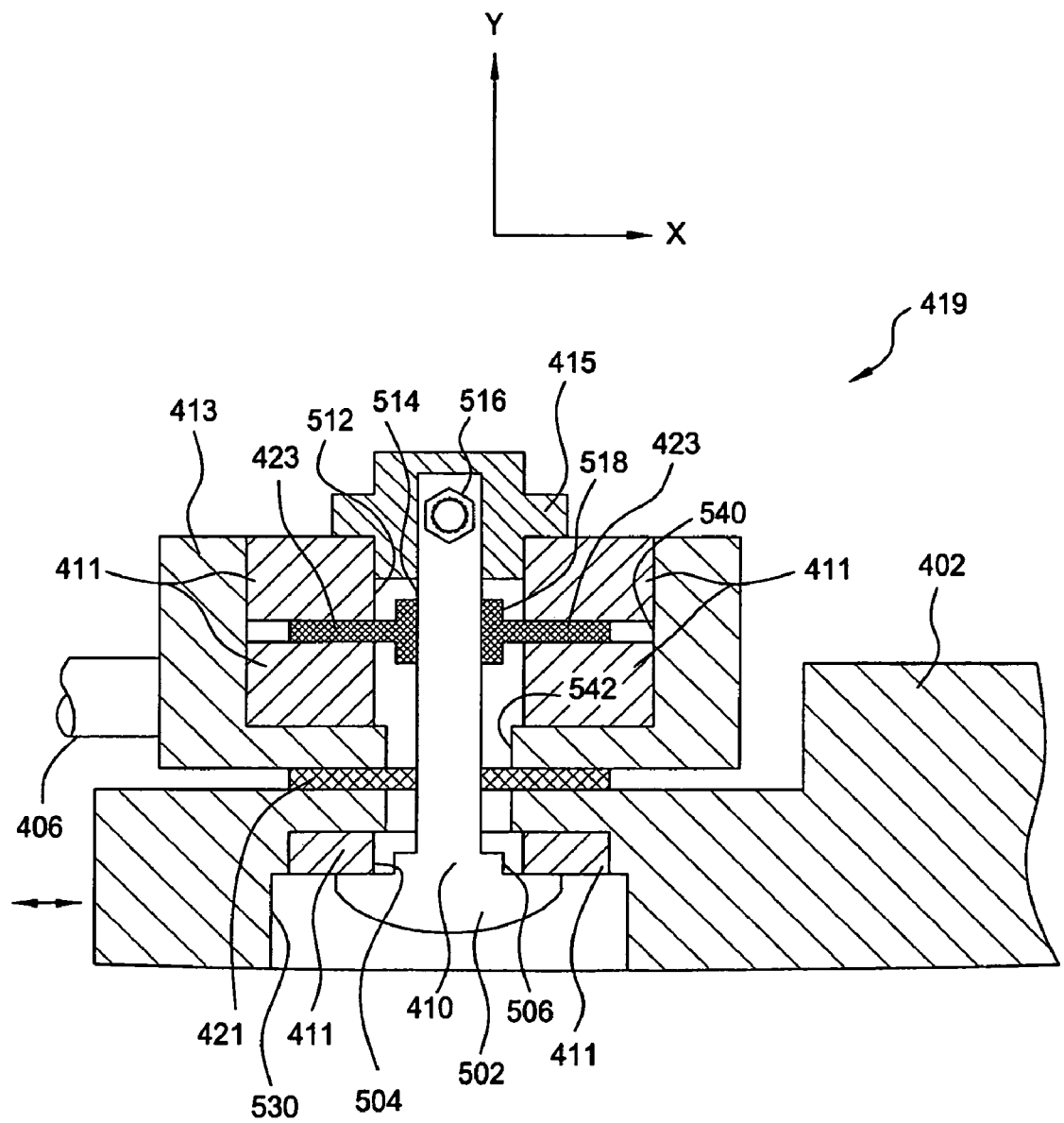
FIG. 5 is a sectional view of one embodiment of a flexible coupling assembly.

Referring to the embodiment depicted in FIG. 5, the flexible coupling 419 includes the linking member 450, a plurality of resilient bushings 411, a thrust washer 421 and a spacer 423. The linking member 450 may be any suitable structure for securing the door member 402 to the lever arm 413, and in the embodiment depicted in FIG. 5, is a bell bolt 410 and a nut 415.

At least one of the resilient bushings 411 is disposed in a recess 530 formed in the door member 402. The recess 530 includes a hole 532 that allows the bell bolt 410 to pass through the door member 402. The bell bolt 410 also passes through a hole 504 of the bushing 411. A head 502 of the bell bolt 410 prevents the bell bolt 410 from passing through the resilient bushing 411. The springiness of the resilient bushing 411 allows the bell bolt 410 to universally pivot (i.e., rotate in at least two planes, for example, about the x and z axes) relative to the door member 402.

The resilient bushing 411 has an inside diameter 504 greater than a diameter 506 of the bell bolt 410. Thus, the bell bolt 410 may move laterally within the resilient bushing 411, thereby accommodating the lateral movement of the door member 402 relative to the lever arm 413.

At least one of the resilient bushings 411 are also disposed in a recess 540 formed in the lever arm 413. A hole 542 formed in the recess 540 allows the bell bolt 410 to pass through the lever arm 413. In the embodiment depicted in FIG. 5, two resilient bushings 411 are disposed around the bell bolt 410 in the recess of the lever arm 413. The nut 415 threaded on the bell bolt 410 captures the bushings 411 in the recess of the lever arm 413. The nut 415 may be pinned, locked or secured by another manner to prevent inadvertent disengagement from the bolt 410. In one embodiment, a set screw 516 is utilized to secure the nut 415 on the bolt 410.

In the embodiment depicted in FIG. 5, two bushings 411 having a spacer 423 interposed therebetween is disposed in the recess in the lever arm 413 on the bell bolt 410. The bushings 411 allow bell bolt 410 to universally pivot (i.e., rotate about the x and y axes) relative to lever arm 413. The bushings 411 have an inside diameter 512 greater than a diameter 514 of the bell bolt 410, thereby accommodating the lateral movement of the door member 402 relative to the lever arm 413. The bell spacer 423 adds rigidity to the movement of the bell bolt 410 in the bushings 411 disposed in the lever arm 413.

A thrust washer 421 is disposed between the door member 402 and the lever arm 413. The thrust washer 421 provides a compliant member to increase the friction resistance between the door member 402 and lever arm 413, thereby adding stiffness and memory that substantially maintains the orientation of the door member 402 relative to the chamber sealing surface between successive opening and closing cycles of the door member 402.

The resilient bushings 411 are fabricated from a resilient material, such as a polymer, or in a spring form. Examples of suitable materials of polymer may be polyurethane, polyamide-imide, such as TORLON®, VITON®, or other suitable resilient materials. Examples of other resilient materials that may comprise bushing 411 include spring forms, such as Belleville springs, fabricated from metal or other suitable spring materials.

The resilient property of the bushing 411 allows the linking member 450 to change both angle and lateral position relative to the lever arm 413 and/or relative to door member 402. The motion provided by the bushings 411 compensates for changes in the orientation of the door member 402 during operation of the load lock chamber. For example, as the ends of the door member 402 move outward (in the x-direction) as the door flattens while contacting the chamber body 316, the resilient bushings 411 accommodate a lateral movement to the bell bolt 410 without transferring excessive lateral force to the lever arm 413. Thus, as the bushings 411 substantially absorb the lateral force transfer, the lever arm 413 is not urged into a position where binding can occur. Also, the flexible coupling 419 accommodates changes in the curvature change of the door member 402 (about the z-axis) without binding and/or distorting the lever arm 413 (or shafts 404, 406), thereby minimizing wear and eliminating a potential source of particles. The flexible coupling 419 additionally allows the door member 402 to pivot (about the x-axis) when aligning by contact with the chamber body.

Returning to FIG. 4, the sidewalls 306, 318 include a recess 416 formed therein that accommodate at least a portion of the lever arm 413, thereby allowing the width and internal volume of the chamber body 316 to be minimized. Each shaft 404, 406 is also respectively coupled by an external actuator arm 414 to the actuators 330, 430. Each external actuator arm 414 and shaft 404, 406 may be splined, keyed or otherwise configured to prevent rotational slippage therebetween.

Each shaft 404, 406 passes through a seal pack assembly 408 that allows rotation of the shaft while maintaining the vacuum integrity of the chamber body 312. The seal pack assembly 408 is generally mounted to the exterior of the chamber body 312 to minimize the width and internal volume of the chamber body 312.

FIGS. 6A-6B are sectional views of door member 402 in open and closed positions. FIG. 6A depicts a curved slit valve door in an opened position. In an open position, the door member 402 is curved, and the deflection of the resilient bushings 411 accommodates the bell bolt 410 in a first orientation between the lever arm 413 and the door member 402. As the actuators 330, 430 coupled to lever arm 413 rotate the door member 402 rotate into a closed position, the door member 402 becomes flat upon being pressed against the chamber body to close the slit valve passage 316. As the door member 402 flattens, the ends coupled by the flexible coupling 419 to the lever arm 413 move outward. The difference between the projected length of the door member 402 in the open and closed positions (e.g., curved and flattened) is illustrated by the offset of imaginary lines 600, 602 extending from the end of the door member 402 depicted in FIGS. 6A-B. The expansion of the door member 402 induces the bell bolt 410 to change orientation and be tilted at an angle relative to the lever arm 413. The bushing 411 also allows a lateral movement of the bell bolt 410 to accommodate to compensate the change in length of the door member 402. The flexible coupling 419 also permits the lever arm 413 to remain substantially unchanged in orientation relative to the shafts 404, 406 passing through the chamber body 316. In addition to the movement induced by the straightening of the curved door member 402, rotation in a second plane is also accommodated by the flexible coupling 419 as the face of the door member 402 pivots to align with the chamber wall upon contact.

Figure 7:
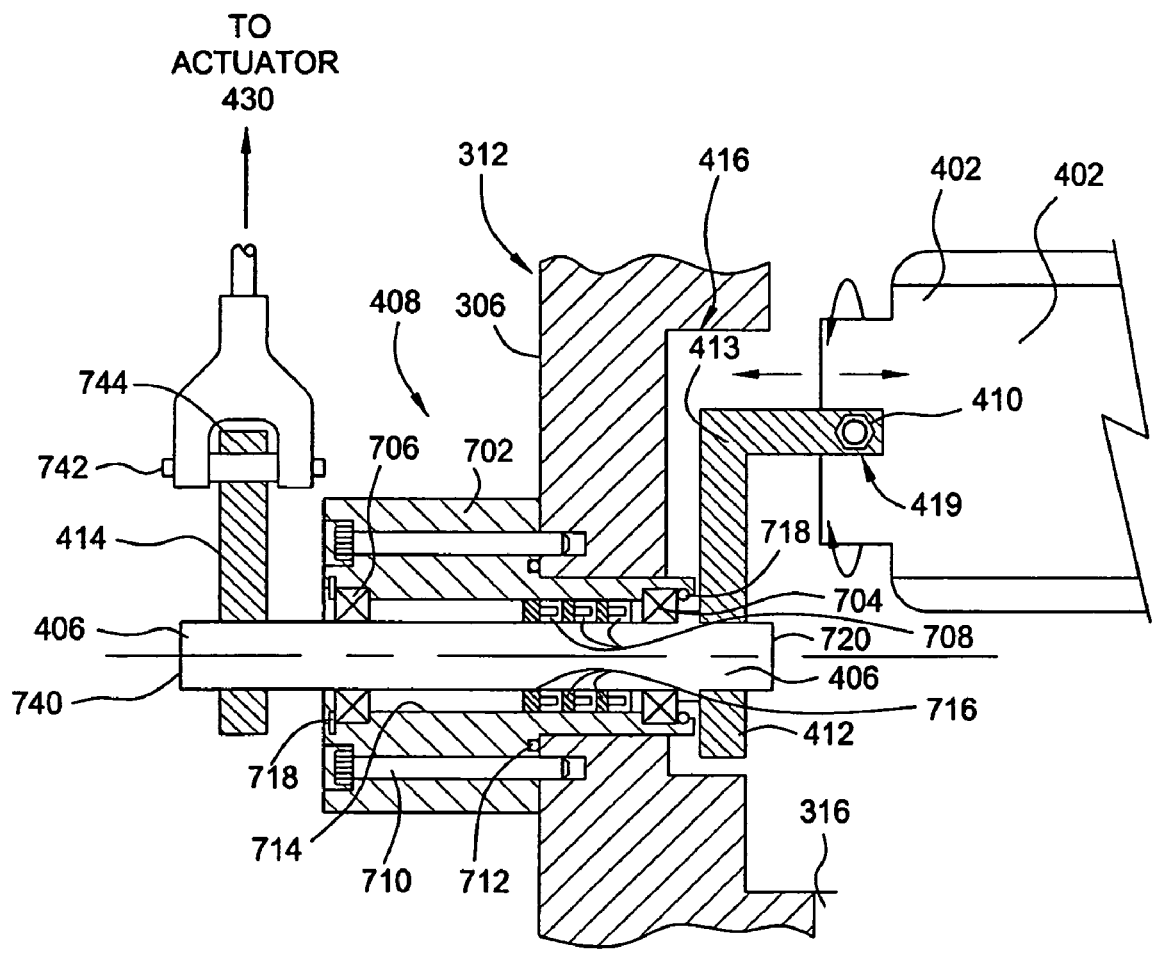
FIG. 7 is a sectional view of one embodiment of a seal pack assembly taken along section line 5-5 of FIG. 4.

FIG. 7 is a sectional view of one embodiment of the seal pack assembly 408. The seal pack assembly 408 includes a housing 702, an inner bearing 704, an outer bearing 706 and one or more shaft seals 708. The housing 702 is generally coupled to the chamber body 312 by a plurality of fasteners 710. An o-ring 712 is disposed between the housing 702 and chamber body 312 to provide a vacuum seal therebetween.

The housing 702 includes a through-hole 714 that allows the shaft 406 to pass through the housing 702. The hole 714 has counterbores at each end that accept the inner and outer bearings 704, 706. Retaining rings 718 prevent the bearings 704, 706 moving out of the hole 714. The bearings 704, 706 are press fit around the shaft 706 to facilitate rotation. In the embodiment depicted in FIG. 7, the bearings 704, 706 are cross-roller bearings.

The one or more shaft seals 708 are disposed in hole 714 and provide a dynamic vacuum seal between the second shaft 406 and the housing 702. In the embodiment depicted in FIG. 7, a plurality of shaft seals 708 are shown separated by spacers 716.

An inner end 720 of the second shaft 406 is coupled to the lever arm 413 in a manner that ensures transfer of rotational motion from the shaft 406 to the arm 413. For example, the lever arm 413 may be mated with the shaft 406 or include a key to ensure rotation. Alternatively, the lever arm 413 may be clamped, pinned, press-fit, welded or bonded to the shaft 406.

Figure 8:
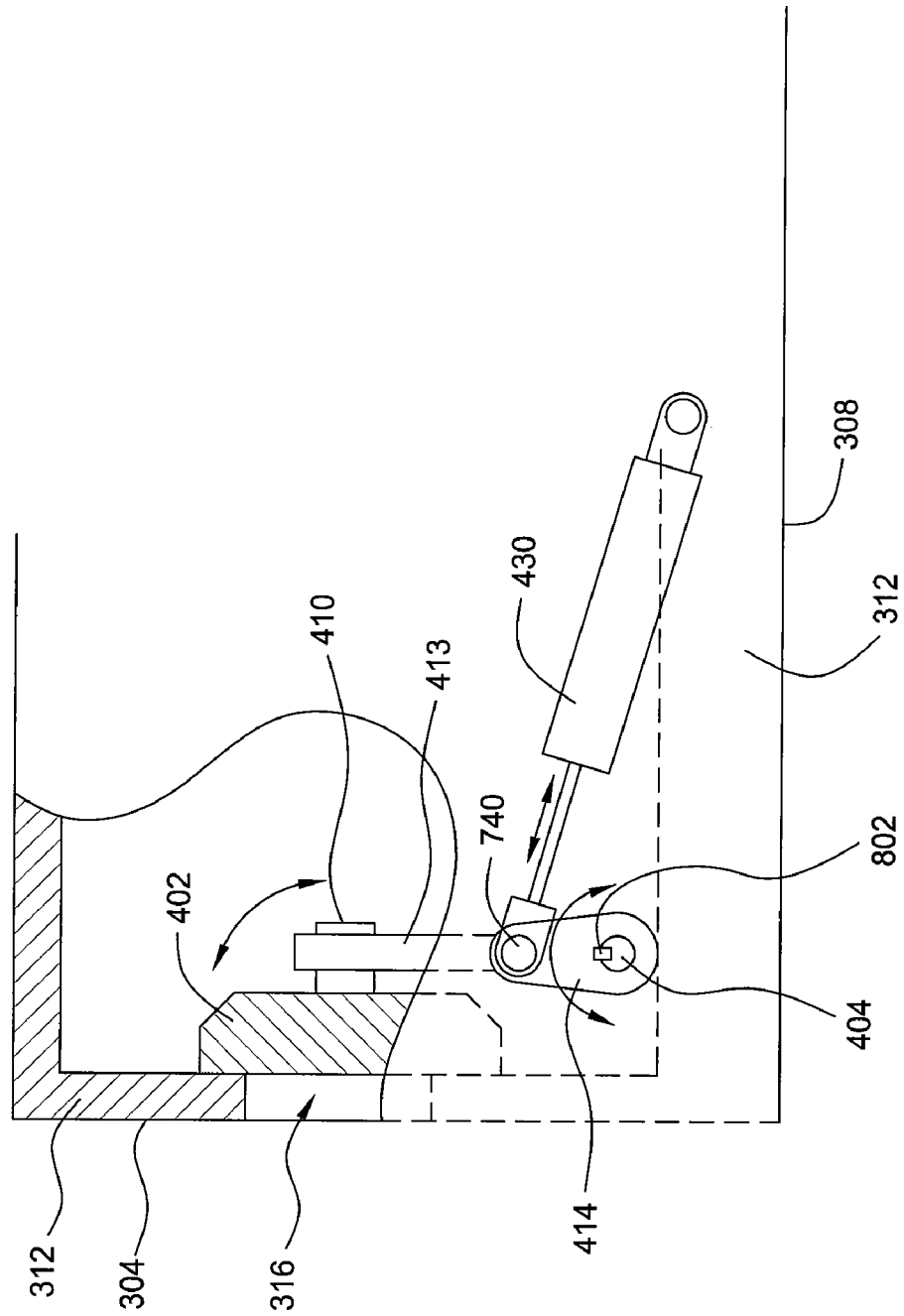
FIG. 8 is a cutaway partial side view of one embodiment of the load lock chamber of FIG. 2.

FIG. 8 depicts a side view of one embodiment of a lever arm 413, an outer end 740 of the first shaft 404 is coupled to the external actuator arm 414 in a manner that ensures transfer of motion of the external actuator arm 414 as rotational motion to the first shaft 404. The second shaft 406 is similarly attached. For example, the external actuator arm 414 may mate with the shaft 404 or include a key 802 to ensure rotation. Alternatively, the external actuator arm 414 may be clamped, pinned, press-fit, welded or bonded to the shaft 404.

Figure 9:
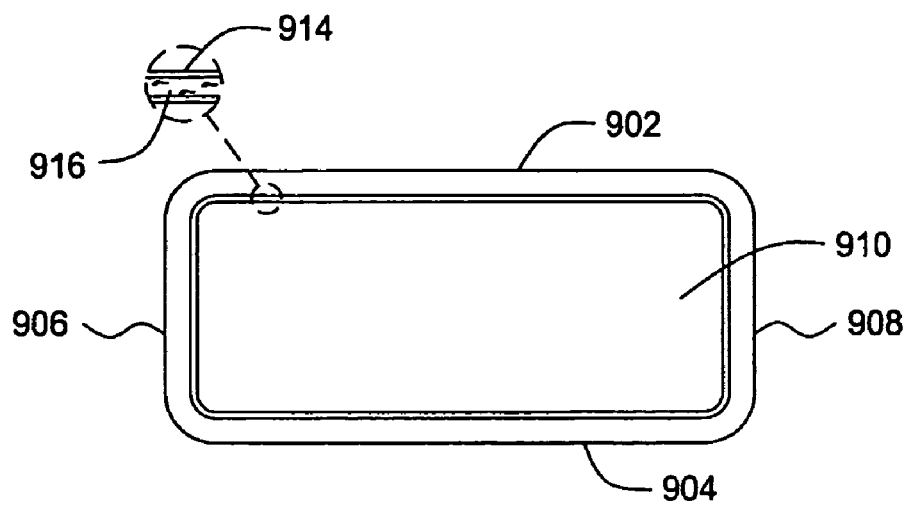
FIGS. 9-10 are front and top views of one embodiment of a door member.
Figure 10:
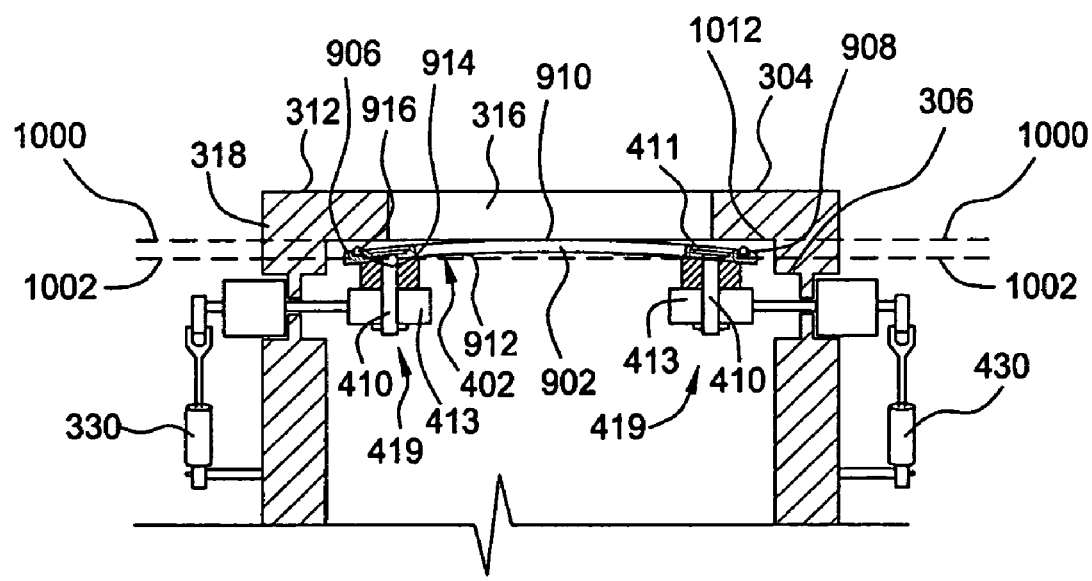

FIGS. 9-10 depict front and top views of one embodiment of the door member 402. The door member 402 is generally elongated, and is fabricated from aluminum or other suitable material. The door member 402 includes major sides 902, 904, minor sides 906, 908, a sealing face 910 and a backside 912. A respective one of the lever arm 413 is coupled to opposite ends of the backside 912 of the door member 402 by a flexible coupling 419, proximate the minor sides 906, 908. In one embodiment, the door member 402 is rectangular and has a width between the minor sides 906, 908 of at least 1260 millimeters. It is contemplated that the door member 402 may be longer or shorter in width to accommodate substrates of different sizes.

A seal gland 914 is formed in the sealing face 910 inward of the sides 902, 904, 906, 908. The seal gland 914 circumscribes the center portion of the door member 402 that covers the substrate access port 316 through the chamber body 312. A seal 916 is disposed in the seal gland 914 and seals the door member 402 to the chamber body 316. The seal 916 is generally configured to prevent contact between the door member 402 to the chamber body 316 when compressed by the actuators 330, 430. In one embodiment, the seal 916 is comprised of an o-ring fabricated from fluoropolymers or other suitable materials. Examples of other seal materials include fluorocarbon (fkm) or perfluoroelastomer (ffkm), nitril rubber (nbr) and silicone. It is contemplated that the seal 916 and seal gland 914 may be alternatively disposed on the chamber body 316.

At least the sealing face 910 of the door member 402 is curved relative to a major axis 1002 connecting the minor sides 906, 908. The major axis 1002 is parallel to an imaginary line 1000 defined by a sealing surface 1012 of the chamber body 316 to which the door member 402 seals. The sealing surface 1012 and door member 402 are shown in an exaggerated spaced-apart relationship in FIG. 10 for clarity. The imaginary line 1000 may also be parallel to the shafts 404, 406 and perpendicular to the minor sides 906, 908. In the embodiment depicted in FIG. 10, the sealing face 910 is convex relative to the line 1000, such that the center of the sealing face 910 contacts the chamber body 312 first as the door member 402 is closed, thereby creating a spring force within the door member 402.

Figure 11:
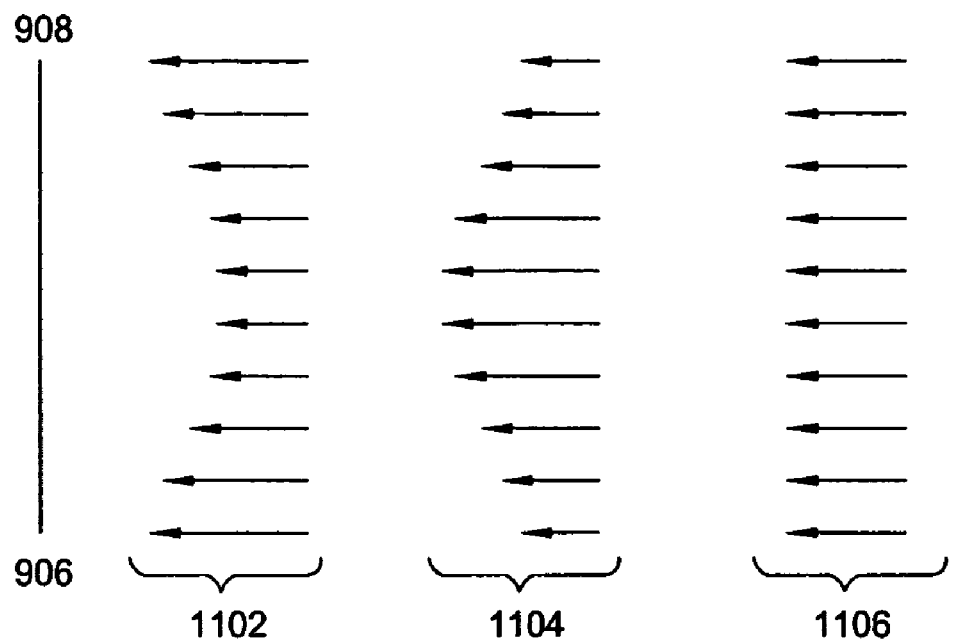
FIG. 11 is a schematic representation of the sealing force on the door member.

In operation, the actuators 330, 430 coupled to lever arms 413 disposed at the minor sides 906, 908 cause the door member 402 to rotate closed. The loading force on the curved door due to the actuators 330, 430 is depicted by arrows 1102 in FIG. 11. As the door rotates closed, a lateral movement of the bell bolt 410 is generated accommodated by the resilient bushing 411 thereby allowing a movement in a longitudinal direction relative to the lever arm 413. Due to the curvature of the door member 402, the center of the door member 402 contacts the chamber body 312 first. As the force of the actuators 330, 430 cause the door member 402 to flatten, the curvature of the door member 402 generates a spring force that increases the seal 916 in the center regions of the door member 402. The loading force due to the spring force of the door member 402 is depicted by arrows 1104 in FIG. 11. The combination of the high door end loading via the actuators 330, 430 is offset by the center spring force of the door member 402 to uniformly compress and load the seal 916 around the substrate access port 316. The sum of the combined loading forces 1102, 1104 is depicted by arrows 1106 in FIG. 11. Under the combined forces of the actuators and spring force created by the door member 402, the flattened sealing face 910 provides uniform loading of the seal 916 around the passage through the chamber body 312, thereby ensuring uniform and reliable vacuum seal around the periphery of the passage, while increasing seal longevity. The amount of curvature of the sealing face 910 may be determined by beam deflection analysis for predetermined door geometries and desired vacuum conditions.

Moreover, as the first and second shafts 404, 406 are short relative to the width of the door member 402 and load lock chamber 200, the deflection of the shafts is small, thereby allowing more efficient transfer of force to the door member 402 from the actuators 330, 430. The shorter shafts 404, 406 also allow for smaller shaft diameters to be utilized, thereby reducing costs associated with long shafts requiring greater diameters for stiffness and the associated hardware of larger scale. Additionally, as the internal actuator arms 412 are disposed in recesses 416 formed in the chamber body 316, the width and interior volume of the load lock chamber 200 may be minimized for a predefined substrate access port width, which beneficially reduces the cost of fabricating the load lock chamber 200 and increases throughput by reducing the volume of the load lock chamber 200 required to vent and pump down during operation.

Figure 12:
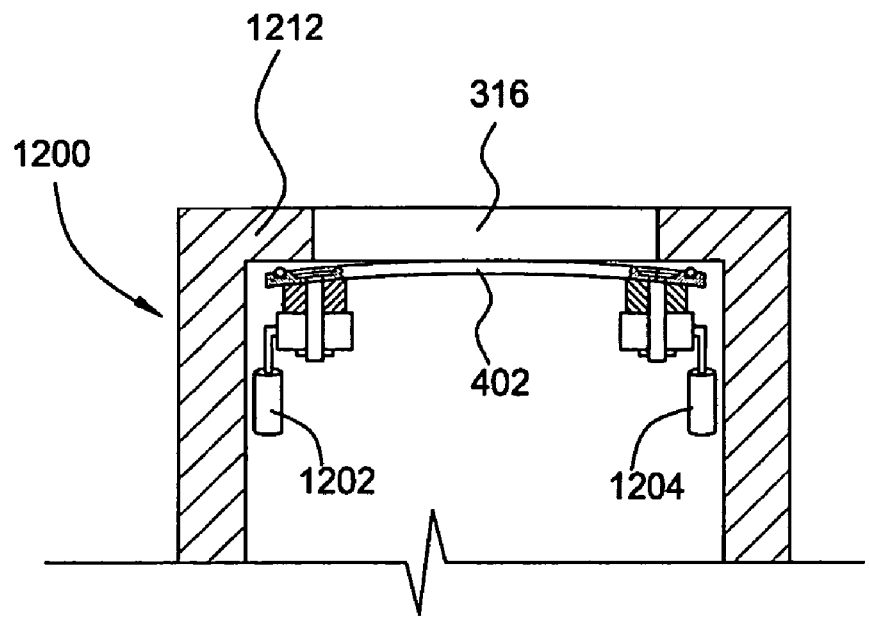
FIG. 12 is a partial sectional view of another embodiment of a load lock chamber.

FIG. 12 is a partial sectional view of another embodiment of a load lock chamber 1200. The load lock chamber 1200 is substantially similar to the load lock chambers described above except wherein the actuators 1202, 1204, coupled to opposite ends of the door member 402 are disposed within the interior of the chamber body 1212.

While the foregoing is directed to the preferred embodiment of the present invention, other and further embodiments of the invention may be devised without departing from the basic scope thereof, and the scope thereof is determined by the claims that follow.

What is claimed is:

1. A chamber, comprising:
a chamber body having a substrate transfer port;
a door member having a curved sealing face positionable to selectively seal the substrate transfer port;
a lever arm; and
a flexible coupling connecting the lever arm to the door member, the flexible coupling configured to allow lateral movement of the door member relative the lever arm, wherein the flexible coupling further comprises:
a first resilient bushing; and
a linking member passing through the first bushing, the door member, and the lever arm.

2. The chamber of claim 1, wherein the flexible coupling further comprises:
a second resilient bushing having the linking member disposed therethrough, wherein the first and second resilient bushings are separated by the lever arm.

3. The chamber of claim 2, wherein the flexible coupling further comprises:
a third resilient bushing having the linking member disposed therethrough and positioned adjacent the second resilient bushing.

4. The chamber of claim 3, wherein the second resilient bushing and the third resilient bushing are separated by a spacer.

5. The chamber of claim 1, wherein the chamber body further comprises a plurality of stacked single substrate transfer chambers.

6. A chamber, comprising:
a chamber body having a substrate transfer port;
a door member having a curved sealing face positionable to selectively seal the substrate transfer port;
a lever arm; and
a flexible coupling connecting the lever arm to the door member, the flexible coupling configured to allow lateral movement of the door member relative the lever arm, wherein the flexible coupling further comprises:
a bolt passing through a first hole formed through an end portion of the door member and a second hole formed through the lever arm;
a first resilient bushing disposed around the bolt and separated by the door member from the lever arm; and
a second resilient bushing disposed around the bolt and separated by the lever arm from the door member.

7. The chamber of claim 6 further comprising:
a spacer disposed between the lever arm and the door member.

8. The chamber of claim 6, wherein the lever arm comprises:
a recess formed therein, the second resilient bushing disposed in the recess.

9. The chamber of claim 6, wherein the chamber body further comprises a plurality of stacked single substrate transfer chambers.

* * * * *

UNITED STATES PATENT AND TRADEMARK OFFICE
CERTIFICATE OF CORRECTION

PATENT NO.        : 7,497,414 B2  
APPLICATION NO.   : 11/326759  
DATED             : March 3, 2009  
INVENTOR(S)       : Lee et al.

Page 1 of 1

It is certified that error appears in the above-identified patent and that said Letters Patent is hereby corrected as shown below:

In the References Cited:

Please delete "5,833,426 11/1998 Marohl" and insert --5,933,426 8/1999 Motoori-- therefor.

Signed and Sealed this

Twenty-second Day of December, 2009

David J. Kappos  
*Director of the United States Patent and Trademark Office*